United States Patent
Cohen

(10) Patent No.: US 11,726,433 B2
(45) Date of Patent: Aug. 15, 2023

(54) CLOCKLESS TIME-TO-DIGITAL CONVERTER

(71) Applicant: Kratos SRE, Inc., San Diego, CA (US)

(72) Inventor: Seth D. Cohen, Birmingham, AL (US)

(73) Assignee: Kratos SRE, Inc., San Diego, CA (US)

(*) Notice: Subject to any disclaimer, the term of this patent is extended or adjusted under 35 U.S.C. 154(b) by 0 days.

(21) Appl. No.: 17/858,845

(22) Filed: Jul. 6, 2022

(65) Prior Publication Data

US 2023/0004124 A1 Jan. 5, 2023

Related U.S. Application Data

(63) Continuation of application No. 16/972,915, filed as application No. PCT/US2019/036372 on Jun. 10, 2019, now Pat. No. 11,415,947.

(60) Provisional application No. 62/682,694, filed on Jun. 8, 2018.

(51) Int. Cl.
| | |
|---|---|
| *H03M 1/50* | (2006.01) |
| *G04F 10/00* | (2006.01) |
| *H03K 5/15* | (2006.01) |
| *H03M 1/14* | (2006.01) |

(52) U.S. Cl.
CPC .............. *G04F 10/005* (2013.01); *H03K 5/15* (2013.01); *H03M 1/141* (2013.01); *H03M 1/504* (2013.01)

(58) Field of Classification Search
USPC ........................................................ 341/166
See application file for complete search history.

(56) References Cited

U.S. PATENT DOCUMENTS

| | | | |
|---|---|---|---|
| 3,614,626 | A | 10/1971 | Dillard |
| 4,318,183 | A | 3/1982 | Byington et al. |
| 4,321,547 | A | 3/1982 | Pickard et al. |
| 4,551,816 | A | 11/1985 | Hyatt |
| 4,581,715 | A | 4/1986 | Hyatt |

(Continued)

OTHER PUBLICATIONS

Abid, A et al. "Implementation of a Chaotically Encrypted Wireless Communication System" [online publication] IEEE; Jul. 2009 [retrieved online Jul. 8, 2019] <URL: <http://citeseerx.istpsu.edu/viewdoc/download?>doi=10.1.1.888.9660&rep=reP1&type=pdf> DOI: 10.1109/ICC.2009.5199069; fourth page, first column.

(Continued)

*Primary Examiner* — Jean B Jeanglaude
(74) *Attorney, Agent, or Firm* — Ballard Spahr LLP

(57) ABSTRACT

Technologies are provided for time-to-digital conversion without reliance on a clocking signal. The technologies include a clockless TDC apparatus that can map continuous pulse-widths to binary bits represented via an iterative chaotic map (e.g., tent map, Bernoulli shift map, or similar). The clockless TDC apparatus can convert separated pulses to a single asynchronous digital pulse that turns on when a sensor detects a first pulse and turns off when the sensor detects a second pulse. The asynchronous digital pulse can be iteratively stretched and folded in time according to the chaotic map. The clockless TDC can generate a binary sequence that represents symbolic dynamics of the chaotic map. The process can be implemented by using an iterative time delay component until a precision of the binary output is either satisfied or overwhelmed by noise or other structural fluctuations of the TDC apparatus.

20 Claims, 12 Drawing Sheets

(56) References Cited

U.S. PATENT DOCUMENTS

| | | | |
|---|---|---|---|
| 4,698,635 A | 10/1987 | Hilton et al. | |
| 4,944,036 A | 7/1990 | Hyatt | |
| 5,426,433 A | 6/1995 | Gertel | |
| 5,517,155 A | 5/1996 | Yamauchi et al. | |
| 5,774,084 A | 6/1998 | Brombaugh et al. | |
| 5,805,094 A | 9/1998 | Roach et al. | |
| 6,072,340 A * | 6/2000 | Deisch | H03M 1/822 327/344 |
| 6,091,354 A | 7/2000 | Beckner et al. | |
| 6,177,904 B1 | 1/2001 | Coenen et al. | |
| 6,504,427 B2 | 1/2003 | Midya et al. | |
| 6,507,177 B2 | 1/2003 | Flock et al. | |
| 7,151,483 B2 | 12/2006 | Dizaji et al. | |
| 7,457,291 B2 | 11/2008 | Lee et al. | |
| 7,613,212 B1 | 11/2009 | Raz et al. | |
| 7,656,341 B2 | 2/2010 | Reeves | |
| 7,782,017 B2 | 8/2010 | Hack et al. | |
| 7,844,796 B2 | 11/2010 | Vorbach et al. | |
| 8,174,293 B2 | 5/2012 | Yoshihara et al. | |
| 8,325,076 B2 * | 12/2012 | Yousif | H03K 9/04 341/166 |
| 9,252,809 B2 | 2/2016 | Hirth | |
| 10,218,343 B1 | 2/2019 | Tomar et al. | |
| 10,656,244 B2 | 5/2020 | Turbiner | |
| 10,746,849 B2 | 8/2020 | Turbiner et al. | |
| 11,265,178 B1 | 3/2022 | Cohen | |
| 11,381,224 B2 | 7/2022 | Cohen | |
| 2002/0080889 A1 | 6/2002 | Dress et al. | |
| 2002/0191690 A1 | 12/2002 | Pendergrass et al. | |
| 2004/0177310 A1 | 9/2004 | Mohan et al. | |
| 2005/0036479 A1 | 2/2005 | Lee et al. | |
| 2005/0078021 A1 * | 4/2005 | Cohen | H03M 5/08 341/53 |
| 2005/0206544 A1 * | 9/2005 | Schallmoser | H03M 1/825 341/144 |
| 2006/0088081 A1 | 4/2006 | Withington et al. | |
| 2007/0040608 A1 | 2/2007 | Magrath et al. | |
| 2007/0110125 A1 | 5/2007 | Fujita et al. | |
| 2007/0291833 A1 | 12/2007 | Shimanskiy | |
| 2008/0204309 A1 | 8/2008 | Reeves | |
| 2009/0135053 A1 | 5/2009 | Negoro et al. | |
| 2010/0164806 A1 | 7/2010 | Pillai | |
| 2010/0244958 A1 | 9/2010 | Tsuji et al. | |
| 2012/0068781 A1 | 3/2012 | Pfaffinger | |
| 2012/0146842 A1 | 6/2012 | Kang | |
| 2012/0268105 A1 | 10/2012 | Mann et al. | |
| 2012/0326760 A1 * | 12/2012 | Kesselring | H03K 3/017 327/175 |
| 2013/0015992 A1 | 1/2013 | Horio et al. | |
| 2013/0057423 A1 | 3/2013 | Kurchuk et al. | |
| 2015/0041625 A1 | 2/2015 | Dutton et al. | |
| 2018/0059215 A1 | 3/2018 | Turbiner et al. | |
| 2019/0271959 A1 | 9/2019 | Firu et al. | |
| 2021/0247722 A1 | 8/2021 | Cohen | |
| 2021/0364617 A1 | 11/2021 | Cohen et al. | |

OTHER PUBLICATIONS

Beal, Aubrey N. et al., "Generating and Detecting Solvable Chaos at Radio Frequencies with Consideration to Multi-User Ranging," Sensors, 2020, 20, 774.

Cohen, S.D. et al., "A pseudo-matched filter for chaos," Chaos, 2012, pp. 1-10, vol. 22, issue 033148, American Institute of Physics.

Cohen, Seth D., "Structured scale-dependence in the Lyapunov exponent of a Boolean chaotic map," 2015.

International Search Report and Written Opinion issued in related application PCT/US2019/036372 dated Oct. 28, 2019.

International Search Report and Written Opinion issued in application No. PCT/US2019/036371 dated Sep. 16, 2019.

Munoz-Pacheco, J.M. et al., "Two New Asymmetric Boolean Chaos Oscillators with No Dependence on Incommensurate Time-Delays and Their Circuit Implementation," Symmetry, 2020, pp. 1-16, vol. 22, issue 506, MDPI.

Rosin, D.P. et al., "Experiments on autonomous Boolean networks," Chaos, 2013, pp. 1-9, vol. 23, issue 025102, MP Publishing LLC.

Rosin, D.P. et al., "Ultrafast physical generation of random numbers using hybrid Boolean networks," Physical Review E, 2013, pp. 1-4, vol. 87, issue 040902(R), American Physical Society.

Tsividis, Y., "Event-Driven Data Acquisition and Digital Signal Processing—A Tutorial," IEEE Transactions on Circuits and Systems—II: Express Briefs, 2010, pp. 577-581, vol. 57, issue 8, IEEE.

Turin, G.L., "An Introduction to Digital Matched Filters," Proceedings of the IEEE, 1976, pp. 1092-1112, vol. 64, Issue 7, IEEE.

Xu, H. et al., "A High-Resolution Leaky Coaxial Cable Sensor Using a Wideband Chaotic Signal," Sensors, 2018, pp. 1-12, vol. 18, issue 4154, MDPI.

Zhang, R. et al., "Boolean chaos," Physical Review E, 2009, pp. 1-4, vol. 80, issue 045202(R), The American Physical Society.

* cited by examiner $$g(f(w)) = \begin{cases} 2w, & \text{for } w \leq \Delta \\ 2(w-\Delta), & \text{for } w > \Delta \end{cases} \quad S_{latch}(w) = s = \begin{cases} 0, & \text{for } w \leq \Delta \\ s = 1 & \text{for } w > \Delta \end{cases}$$

Let $\Delta = 10$ ns and $w_0 = 5.63$ ns $g(f(w_0 = 5.63 \text{ ns})) = w_1 = 11.26$ ns $g(f(w_1 = 11.26 \text{ ns})) = w_2 = 2.52$ ns, $g(f(w_2 = 2.52 \text{ ns})) = w_3 = 5.04$ ns, $g(f(w_3 = 5.04 \text{ ns})) = w_4 = 10.08$ ns, $g(f(w_4 = 10.08 \text{ ns})) = w_5 = 0.16$ ns, $\vdots$ $S_{latch}(w_0) = S_0 = 0$
$S_{latch}(w_1) = S_1 = 1$
$S_{latch}(w_2) = S_2 = 0$
$S_{latch}(w_3) = S_3 = 0$
$S_{latch}(w_4) = S_4 = 1$
$S_{latch}(w_5) = S_5 = 0$
$\vdots$ $s = [S_0, S_1, S_2, S_3, S_5, S_5, \ldots] = [0, 1, 0, 0, 1, 0, \ldots]$ Shift map produces binary coding $\longrightarrow$ *binary coding* $[0, 1, 0, 0, 1, 0, \ldots]$ $2\Delta * (0*(1/2) + 1*(1/2)^2 + 0*(1/2)^3 + 0*(1/2)^4 + 1*(1/2)^5 + 0*(1/2)^6 + \ldots) = 5.625$

FIG. 3

CLOCKLESS TIME-TO-DIGITAL CONVERTER

CROSS-REFERENCE TO RELATED APPLICATION

This application is a continuation of prior application Ser. No. 16/972,915, filed Dec. 7, 2020, which is a national stage filing under 35 U.S.C. § 371 of International Application No. PCT/US2019/036372, filed on Jun. 10, 2019, which claims the benefit of U.S. Provisional Patent Application No. 62/682,694, filed Jun. 8, 2018, the content of which is hereby expressly incorporated by reference herein in its entireties.

BACKGROUND

Time-to-digital converters (TDCs) are commonly used to recognize events and provide a digital representation of a time that the events occur. Existing implementations of TDCs are commonly based on the use of reference clocks. Reference clocks can introduce noise and other constraints on systems such as a discrete measurement resolution. Further, the speed of a clocking device can limit the resolution of a clocked TDC. Thus, current TDCs are inadequate where high resolution and a high precision time interval measurements are required.

SUMMARY

It is to be understood that both the following general description and the following detailed description are exemplary and explanatory only and are not restrictive. Provided are methods and systems for clockless continuous-time chaos-based time-to-digital conversion. The methods and systems can tag (e.g., detect, mark, identify, or similar) times of discrete events, such as arrival times of photons for ranging or laser characterization, for example. A sensor can be used to detect a plurality of events separated by time. For example, the sensor can detect a plurality of events occurring at different time intervals. Each event of the plurality of events can cause the sensor to generate a signal (e.g., an electronic pulse) of a plurality of signals. Each event of the plurality of events can be represented by a respective signal of the plurality of signals in the time-domain. A TDC can measure each time interval between the plurality of events and convert those measurements into a digital representation that can be stored or analyzed. Thus, each time interval can be mapped to a digital signal (e.g., a binary signal) that can be recorded/represented. For example, each time interval can be mapped to a digital signal that can be recorded/represented by an iterative chaotic map (e.g., a tent map, a Bernoulli shift map, a logistic map, or similar).

Embodiments of the disclosed technologies can be implemented in fully-electronic assemblies, including transistors; CMOS logic gates; field programmable gate-arrays (FPGAs); application-specific integrated circuits (ASICs); a combination of the foregoing; or similar. Assemblies that include FPGAs are highly practical platform for implementing the principles of this disclosure because, amongst other things, FPGAs are reconfigurable and can be implemented/updated using software only.

In at least some embodiments, an asynchronous digital pulse can have a leading edge that corresponds to one signal/event and a trailing edge that corresponds to the next or neighboring signal/event. Thus, the width of this asynchronous digital pulse is an electronic representation of the time interval between these two events. The techniques disclosed herein can addresses the generation of a binary representation of such continuous pulse signals without reliance on a clocking signal.

To do so, real-time pulse operations that transform the duration of a logic signal result in a continuous pulse signal of a desired width in the time domain. In particular, these operations both increase/stretch and decrease/fold the width of a continuous pulse signal according to an iterative chaotic map (e.g., a tent map, a Bernoulli shift map, or similar). This iterative chaotic map also produces binary bits that can be used to represent a digital word. The processes described above can be recursive. For example, the processes can be repeated using an iterative feedback delay loop.

Additional advantages will be set forth in part in the description which follows or may be learned by practice. The advantages will be realized and attained by means of the elements and combinations particularly pointed out in the appended claims.

BRIEF DESCRIPTION OF THE DRAWINGS

The annexed drawings are an integral part of the disclosure and are incorporated into the present specification. The drawings illustrate examples of embodiments of the disclosure and, in conjunction with the description and claims, serve to explain, at least in part, various principles, features, or aspects of the disclosure. Some embodiments of the disclosure are described more fully below with reference to the drawings. However, various aspects and elements of the disclosure can be implemented in many different forms and should not be construed as being limited to the implementations set forth herein. Like numbers refer to like, but not necessarily the same or identical, elements throughout. The accompanying drawings can be briefly characterized as follows.

FIG. 1B illustrates an example of latch circuitry and timing, in accordance with one or more embodiments of this disclosure.

FIG. 3 presents an example of a formalism that supports folding, stretching, and latching operations of a time-based chaotic shift map, in accordance with one or more embodiments of this disclosure.

DETAILED DESCRIPTION

Figure 1:
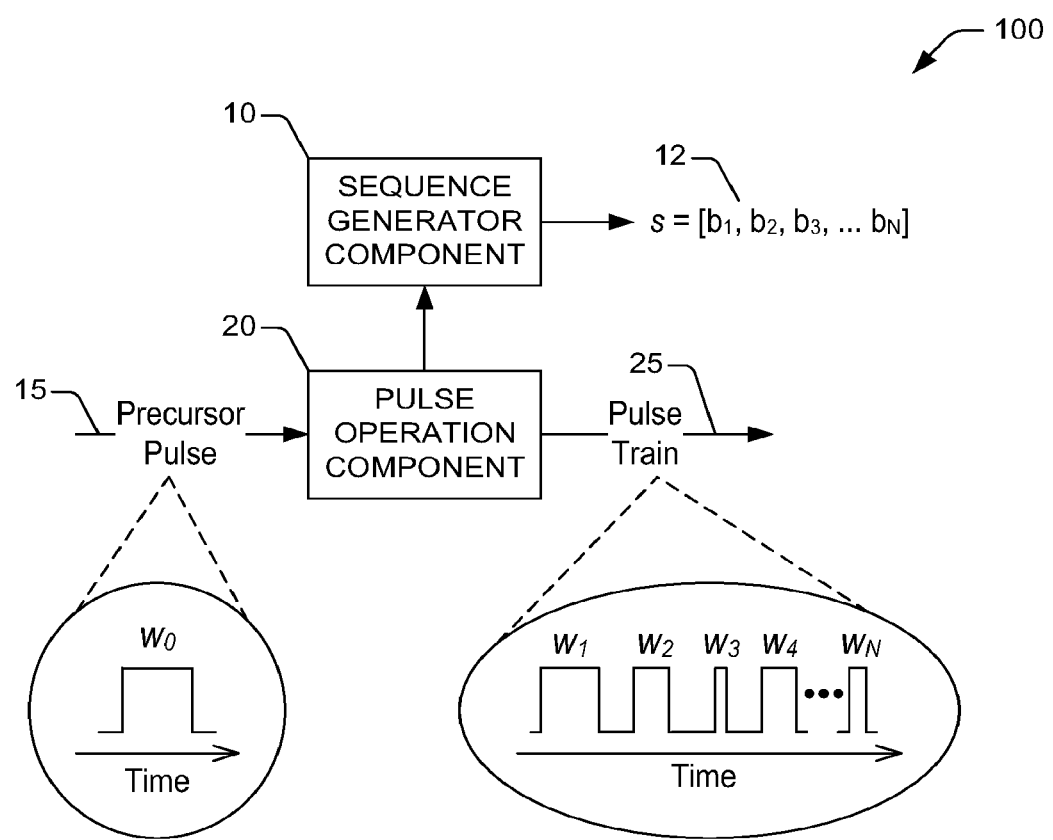
FIG. 1 illustrates an example of a clockless TDC apparatus, in accordance with one or more embodiments of this disclosure.

Before the present methods and systems are disclosed and described, it is to be understood that the methods and systems are not limited to specific methods, specific components, or to particular implementations. It is also to be understood that the terminology used herein is for the purpose of describing particular embodiments only and is not intended to be limiting.

As used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the examples included therein and to the Figures and their previous and following description.

As will be appreciated by one skilled in the art, the methods and systems may take the form of an entirely hardware embodiment or an embodiment combining software and hardware aspects. Furthermore, the methods and systems may take the form of a computer program product on a computer-readable storage medium having computer-readable program instructions (e.g., computer software) embodied in the storage medium. More particularly, the present methods and systems may take the form of web-implemented computer software. Any suitable computer-readable storage medium may be utilized including hard disks, CD-ROMs, optical storage devices, or magnetic storage devices.

Embodiments of the methods and systems are described below with reference to block diagrams and flowchart illustrations of methods, systems, apparatuses and computer program products. It will be understood that each block of the block diagrams and flowchart illustrations, and combinations of blocks in the block diagrams and flowchart illustrations, respectively, can be implemented by computer program instructions. These computer program instructions may be loaded onto a general purpose computer, special purpose computer, or other programmable data processing apparatus to produce a machine, such that the instructions which execute on the computer or other programmable data processing apparatus create a means for implementing the functions specified in the flowchart block or blocks.

These computer program instructions may also be stored in a computer-readable memory that can direct a computer or other programmable data processing apparatus to function in a particular manner, such that the instructions stored in the computer-readable memory produce an article of manufacture including computer-readable instructions for implementing the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions specified in the flowchart block or blocks.

Accordingly, blocks of the block diagrams and flowchart illustrations support combinations of means for performing the specified functions, combinations of steps for performing the specified functions and program instruction means for performing the specified functions. It will also be understood that each block of the block diagrams and flowchart illustrations, and combinations of blocks in the block diagrams and flowchart illustrations, can be implemented by special purpose hardware-based computer systems that perform the specified functions or steps, or combinations of special purpose hardware and computer instructions.

As is described in greater details below, the disclosed TDC apparatuses and techniques utilize a relationship between modular functions and chaotic maps, and avoid reliance on clocking signals, to convert a continuous pulse width into a digital sequence of 1s and 0s. The present disclosure relates to clockless continuous-time chaos-based time-to-digital conversion. A sensor can be used to detect a plurality of events separated by time. For example, the sensor can detect a plurality of events occurring at different time intervals. Each event of the plurality of events can cause the sensor to generate a signal (e.g., an electronic pulse) of a plurality of signals. Each event of the plurality of events can be represented by a respective signal of the plurality of signals in a time domain. A time-to-digital converter can measure each time interval between the plurality of events. Each time interval can be mapped to a digital signal (e.g., a set of binary signals or bits) that can be recorded/represented. For example, each time interval can be mapped to a digital signal that can be recorded/represented by an iterative chaotic map (e.g., a tent map, a Bernoulli shift map, a logistic map, or similar).

A TDC apparatus can include a plurality of logic gates. Each logic gate of the plurality of logic gates can convert each signal (e.g., electronic pulse) of the plurality of signals to asynchronous voltage pulses. The single asynchronous digital pulses can have a leading edges that correspond to an event or signal (such as photon arrival) and trailing edges that corresponds to next or neighboring events. For example, the single asynchronous digital pulse can turn on when the first signal is generated and/or detected and turns off when next signal is generated and/or detected, where this process is repeated to represent the time interval between neighboring events using asynchronous pulses.

In order to represent all events of interest in asynchronous pulses, parallel channels of asynchronous pulses can be used. As such parallel TDC apparatuses can be used together to measure and record all event times. This parallelization process can also be repeated across more than two channels to create additional space between asynchronous event pulses in case the TDC apparatuses have latency in the transformation and recording of the digital words that represent the timings of the events.

Each of the one or more logic gates of the plurality of logic gates can stretch (increase) and fold (decrease) a signal of the plurality of signals in time (e.g., generate a pulse-width corresponding to a respective signal of the plurality of signals received) according to an iterative chaotic map (e.g., a tent map, a Bernoulli shift map, a logistic map). The iterative chaotic map can be used to map stretched and folded signals (e.g., generated pulse-widths) to binary bits. The binary bits can represent a digital word. The result is a clockless (e.g., unclocked, asynchronous, and so forth) TDC system.

In some embodiments, the TDC apparatus 100 can be implemented to operate in any physical system (e.g., a non-simulated process). The precursor pulse 15 can be embodied in a wave propagating in a physical medium. The wave can be, for example, an electromagnetic wave or a pressure wave. The physical medium can in turn be a solid or a fluid that permits the propagation of such a wave. In some configurations, the precursor pulse 15 can be vacuum. The binary sequence s 12 also can be embodied in, for example, a pulse train propagating in the physical medium. The pulse operation component 20 can include components that can receive the precursor pulse 15 and the produce the binary sequence s 12, and can generate the pulse train 25 by implementing chaotic maps, in accordance with aspects described herein. In some embodiments, the pulse train 25 can be embodied in a wave that also can propagate in the physical medium. In other embodiments, the target pulse train 25 can be embodied in an electronic signal propagating in solid-state circuitry.

To mitigate the analog effects and experimental noise, the process described can be recursive. For example, the process can be repeated using an iterative time delay component, such as a delay feedback loop.

Embodiments of the disclosed technologies can be implemented in fully-electronic assemblies, including transistors; CMOS logic gates; field programmable gate-arrays (FPGAs); application-specific integrated circuits (ASICs); a combination of the foregoing; or similar. Assemblies that include FPGAs are highly practical platform for implementing the principles of this disclosure because, amongst other things, FPGAs are reconfigurable and can be implemented/updated using software only.

Other embodiments of the technologies can be implemented in numerous physical systems, such as optical systems, opto-electronic systems, or acoustic systems, where the logic signals can be present in either a physical medium (electromagnetic waves, pressure waves, etc.) or in the electronic elements used to measure such signals. Yet other embodiments of the disclosed technologies can be implemented in hybrid systems that combine electronic logic elements with other physical representations. In such systems, for example, optical delays can be made using the open-air transmission of photons and acoustic delays can be made using piezo-electric transducers and materials. These delays can serve as elements of a pulse-width stretching component or a pulse-width folding component in a chaotic map component in accordance with this disclosure, where electronic sensors and detectors couple signals into and out of these other processing media.

FIG. 1 and FIGS. 1A-1E illustrate various aspects of a system for clockless continuous-time chaos-based time-to-digital conversion. Those skilled in the art will appreciate that present methods may be used in systems that employ both digital and analog equipment. One skilled in the art will appreciate that provided herein is a functional description and that the respective functions can be performed by software, hardware, or a combination of software and hardware. Understanding the distinct roles of noise and determinism on a clockless continuous-time chaos-based time-to-digital conversion system is an important factor in mitigating their effects. Chaos can be realized in a clockless continuous-time chaos-based time-to-digital conversion system. The clockless continuous-time chaos-based time-to-digital conversion system can be constructed using asynchronous logic gates (e.g., field programmable gate arrays (FPGAs)) to form a map operator that outputs an unclocked pulse-train (e.g., digital word) of varying widths. The unclocked pulse-train (e.g., digital word) of varying widths can be used to iterate a chaotic map. The unclocked pulse-train (e.g., digital word) of varying widths can indicate the symbolic dynamics of the chaotic map. The advantages of using a chaotic map are that the resolution is determined by noise in the system (e.g., not a discrete clock cycle). Additionally, any known methods can be used for error correction, such as error correction techniques routinely applied to iterative analog-to-digital (ADC) systems.

FIG. 1 is a schematic block diagram of an example of a TDC apparatus 100, in accordance with one or more embodiments of this disclosure. TDC apparatus 100 uses continuous/clockless stretching and folding operations of chaotic maps to measure (with a specified resolution) and/or to convert a continuous time interval (e.g., pulse width) into a set of binary signals that can be stored in digital memory. In other words, the TDC apparatus 100 quantizes the width of continuous/unclocked logic signal 15 (referred to as precursor pulse 15; "high" and "low" signals, for example) as they propagate through the TDC apparatus 100, without the use of a clock. To that end, the TDC apparatus 100 includes a pulse operation component 20 that process the precursor pulse 15 such that the length of the precursor pulse 15 (e.g., a logic signal) is stretched (e.g., amplified) and folded (e.g., shortened in a manner that maintains the amplification of small differences) back into a usable interval as the precursor signal 15 propagates through the pulse operation component 20. During or after this process, the pulse width is thresholded (e.g., measured against a reference time interval). The pulse operation component 20 can iterate such a process essentially continuously.

For example, the precursor pulse 15 is an unclocked logic signal, which can be embodied in a square pulse of $w_0$. As the precursor pulse 15 propagates through the pulse operation component 20, a pulse width $w_0$ is stretched by a known multiplicative factor m>1 and the resulting pulse has width $mw_0$. As such, the pulse operation component 20 can perform a time-stretch operation that amplifies small variations in a pulse's width. Note that for a single iteration of the logic signal through the pulse operation component 20, small variations in the pulse width may still be impractical/impossible to measure. However, by repeating the pulse-width stretching over several iterations k, where the output pulse width is described by $w_{k+1}=mw_k$, the microscopic differences between two different precursor pulse widths will be amplified and eventually be viewed on a macroscopic scale.

Overall, this stretching process can be efficient for performing time-amplification/stretching, but in order to implement such a process many times essentially continuously, a mechanism is needed that keeps the length of the logic signals bounded (e.g., for many iterations, the length of the logic signal can continue to expand in time-domain and, eventually, the length can be too large for the system's dynamic range). Thus, the pulse operation component 20 also can implement a second mechanism that keeps the signals bounded while still maintaining the amplification of small differences: a folding operation. Here, the logic signal's pulse width is kept bounded using a structure that performs a modular-like operation on $w_k$. This operation takes values of $w_k$ that would be amplified beyond a certain point and maps them back into a usable interval without undoing the pulse-width stretching that amplifies small differences. An example of this folding mechanism includes operation that decreases the width $mw_k$ by a constant amount c when $mw_k$ is larger than a threshold value T (e.g., $mw_k$>7) such that the total operation yields $mw_k$–c. threshold value Tin pulse width, Thus, as the pulse is stretching iteratively, it is folded back into an interval of interest to keep its value bounded.

Such combination of pulse-width stretching and pulse-width folding directly corresponds to the operations of chaotic maps. Many types of chaotic maps can be implemented (e.g., tent map, logistic map, etc.). Regardless of the type of map, the pulse operation component 20 can perform iterative continuous operations on the length of the precursor signal 15 (e.g., a logic signal or pulse width) to provide an amplified version of the pulse's length, where this amplification is followed by a folding process and thus the overall mechanism is identical to that of chaotic maps (folding and stretching is a key component of chaotic maps).

To obtain binary representations of the precursor pulse 15, in some embodiments, the pulse widths of such chaotic maps can be partitioned using a threshold or partition. In this partitioning, the pulse widths $w_k$ that exit the chaotic map can be assigned respective bit values $b_k$ based on the selected partition (threshold). For example, if $mw_k$>T, then $b_k$=1 and if $mw_k \leq T$ then $b_k$=0. This process can be similar to the measuring the symbolic dynamics of a chaotic map.

Thus, the operations of the TDC apparatus 100 can begin with the precursor pulse 15 having an initial pulse width $w_0$ that enters into the TDC, the pulse operation component 20 can iterate a chaotic map multiple times. After each iteration k of the map, a pulse width $w_k$ is generated and assigned a bit value $b_k$. Bits generated in such a fashion can be stored in sequential order in a memory component (such as a storage device or storage circuitry). These bit streams can then be used to recover the original width $w_0$ using algorithms, post processing, or any other means. The number K of iterations of the map represents the bit depth or resolution of the pulse-width measurement/conversion process. More iterations are equivalent to a higher-resolution TDC, where eventually the noise-floor of the system will cause bits to be unstable.

Figure 1A:
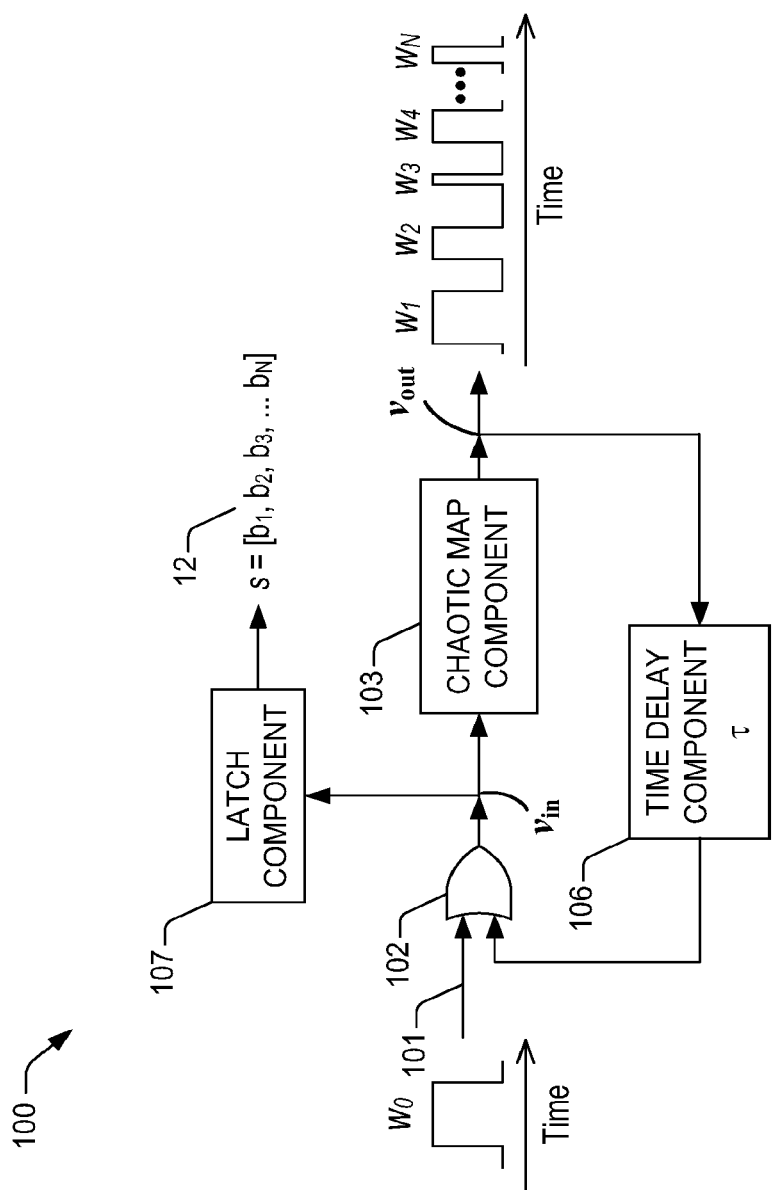
FIG. 1A illustrates another example of a clockless TDC apparatus, in accordance with one or more embodiments of this disclosure.

FIG. 1A is a schematic block diagram of an example of a system 100 for clockless continuous-time chaos-based time-to-digital conversion, in accordance with one or more embodiments of this disclosure. The system 100 can exploit propagation delays of pulses (electronic pulses, input voltage pulses, etc.) as they transmit through logic gates or other types of elements. The system 100 can remain in a stable steady state where, $v_{out}$=0 V, until an input pulse 101 (e.g., electronic pulses, input voltage pulses, and the like) with a continuous width represented by $w_0$ is provided/fed as an input to the system 100. The input pulse 101 (e.g., analog signal, a representation of timing between events, and the like) can be provided/fed to a logic OR gate 102. The logic OR gate 102 can transmit the input pulse 101 as an asynchronous logic pulse. Without intending to be bound by theory and/or design, the OR gate 102 also enables the system 100 to generate a self-sustaining pulse train after an initial pulse (e.g., the input pulse 101) is provided/fed as an input to the system 100. For example, after an initial pulse (e.g., the input pulse 101) is provided/fed as an input to the system 100, an output (e.g., output voltage $v_{out}$) can be fed back (e.g., routed, provided, etc.) as an input to the OR gate 102 after a time delay component 106. The time delay component 106 (e.g., delay line) can cause a propagation delay time/period T.

The OR gate 102 can also continuously provide the input $v_{in}$ to latch component 107 (e.g., flip-flop circuitry, latch circuitry, SR-latch, or similar). The latch component 107 can compare a defined time interval to the width of a signal (e.g., the output of the OR gate 102, $v_{in}$) generated by a chaotic map component 103. Based on such a comparison, the latch component 107 can generate a binary sequence 12. The chaotic map component 103 can iterate dynamics on a one-dimensional (1D) map. The chaotic map can be, for example, a tent map, a Bernoulli shift map, a logistic map, or similar.

The binary sequence 12 can be stored. The binary sequence 12 can be stored as digital bits (e.g., digital bits of a digital word) generated by the latch component 107. The binary sequence 12 can be used to determine/recover the width of the continuous width signal Wo.

The output of the OR gate 102 can continuously provide the input $v_{in}$ (e.g., input pulses, stretched and folded pulses, a stretched and folded input pulse 101, or the like) to the map operator 103. The OR gate 102 can continuously provide the input $v_{in}$ to the chaotic map component 103 according to an OR gate truth table (not shown).

Results of the iterations implemented by the chaotic map component 103 can be can be pulses of varying widths, represented by $w_1$ through $w_K$, respectively, where K is a natural number. Notably, according to the system 100, neighboring pulses (e.g., electronic pulses, voltage pulses, and the like) do not collide, overlap, or directly interact.

Figure 1B:
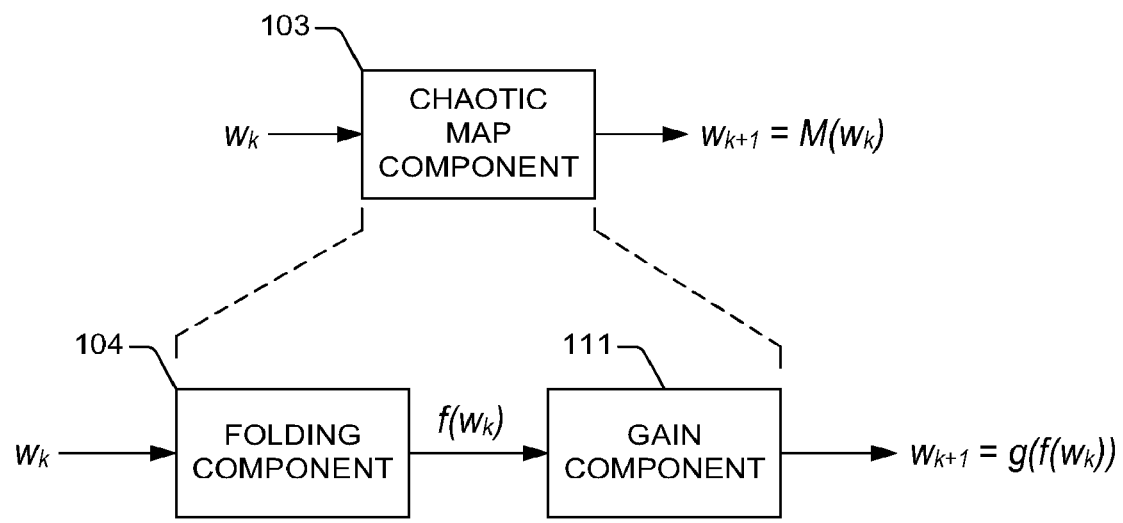
FIG. 1B illustrates an example of a component that implements a chaotic map, in accordance with one or more embodiments of this disclosure.

For a chaotic map M, each transformation iteration $w_{k+1}=M(w_k)$ of a prior transformation iteration $w_k$ can be determined as a gain function g(·) applied to the output of a folding function $f(·)$ having as an argument $w_k$. Namely, $w_{k+1}=M(w_k)=g(f(w_k))$. FIG. 1B is a schematic block diagram that illustrates an example of the chaotic map component 103, in accordance with one or more embodiments of this disclosure. As is illustrated, the map component 103 can include pulse-width folding component 104 that can apply a folding function to an input signal. The chaotic map component 103 also can include a gain component 111 that applies a gain function to an output signal from the folding component 104.

Thus, the pulse-width folding component 104 and the pulse-width gain component 111 can receive the input pulse of defined width $w_k$ and generate an output pulse of width $w_{k+1}=M(w_k)$ according to the combined operations of the folding and stretching process relative to the input pulse. For example, an input pulse having $w_k=1$ μs can be stretched in time to yield $w_{k+1}=2$ μs. The chaotic map component 103 can stretch and/or fold an input pulse according to any value. The pulse-width folding component 104 and the pulse-width gain component 111 can stretch an input pulse to any value. The pulse-width folding circuitry 104 and the pulse-width gain component 111 permit recording and/or representing chaos in a system, such as the system 100, by providing sufficient conditions for the onset of chaos, for example.

In some configurations, the chaotic map component 103 can be embodied in, or can include, a field programmable gate array (FPGA) or an application-specific integrated circuit (ASIC), or a combination of both. Accordingly, in such configurations, the pulse-width folding component 104 can include circuitry that implements the folding function $f(\cdot)$. In turn, the pulse-width stretching component 111 can include circuitry that implements the gain function $g(\cdot)$.

Back to FIG. 1A, to demonstrate chaos in a system (e.g., chaos in the system 100), the output of the map operator 103 (e.g., the output voltage $v_{out}$) can be provided/fed to a comparator, such as the logic OR gate 102. The output of the map operator 103 (e.g., the output voltage $v_{out}$) can be compared against a reference signal. If output of the map operator 103 is higher than the reference, the output of the OR gate 102 can be set to 1, otherwise, the output of the OR gate 102 can be set to 0.

As previously described, the output of the map operator 103 (e.g., the output voltage $v_{out}$) can be fed back (e.g., routed, provided, etc.) as an input to the OR gate 102. The output of the OR gate 102 can continuously provide the input $v_{in}$ to the map operator 103. The output $v_{out}$ (e.g., output voltage) can be fed back (e.g., routed, provided, etc.) as an input to the logic OR gate 102 via the time delay component 106 (e.g., delay line). The output of the system 100 can be shifted by 1 (e.g., shifted to the right) beginning with a most significant bit (MSB) of a digital word after each iteration. The process can be repeated to generate another bit of the digital word (e.g., the next bit of a digital word). The time delay component 106 can include, in some embodiments, a plurality of logic elements, such as an even number of NOT gates.

Figure 1C:
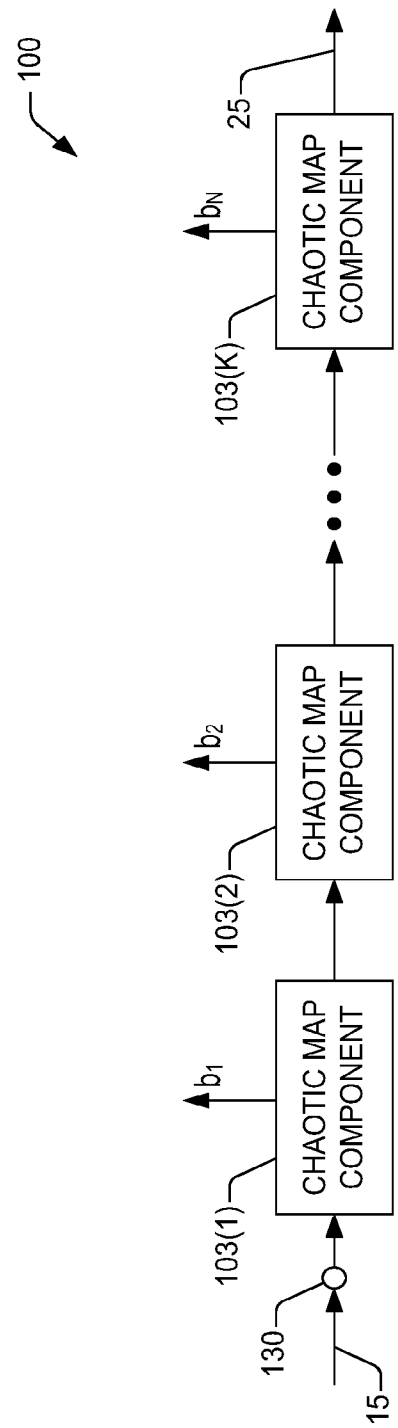
FIG. 1C illustrates an example of a component included in a clockless TDC apparatus, where the component operates on a continuous pulse signal, in accordance with one or more embodiments of this disclosure.

Although the clockless TDC apparatus 100 shown in FIG. 1A relies on a delay feedback loop to permit the iterative operations on the input pulse 101, the disclosure is not so limited. In some embodiments, as is illustrated in FIG. 1C, the clockless TDC apparatus 100 can include an ingestion component 130 that receives the precursor pulse 15 and N chaotic map components 103(1), 103(2), . . . 103(N) arranged in series. In such an embodiment, to generate the output pulse train 25, output signal from a first chaotic map component 103(k) is supplied to a second chaotic map component 103(k+1); here, $1 \leq k < N$. Each chaotic map component 103(k) (k=1, 2, . . . N) generates an output pulse signal by applying a particular chaotic map M, where the output pulse signal has a width $w_k$. In addition, each chaotic map component 103(k) (k=1, 2, . . . N) can generate a bit $b_k$ that constitutes the binary sequence s 12 (FIG. 1).

In some embodiments, rather than relying entirely on a single chaotic map component 103 and a delay feedback look (see FIG. 1A) or on a series of chaotic map components 103, the clockless TDC apparatus 100 can include a combination of both multiple chaotic map components and one or several delay feedback loops.

Figure 1D:
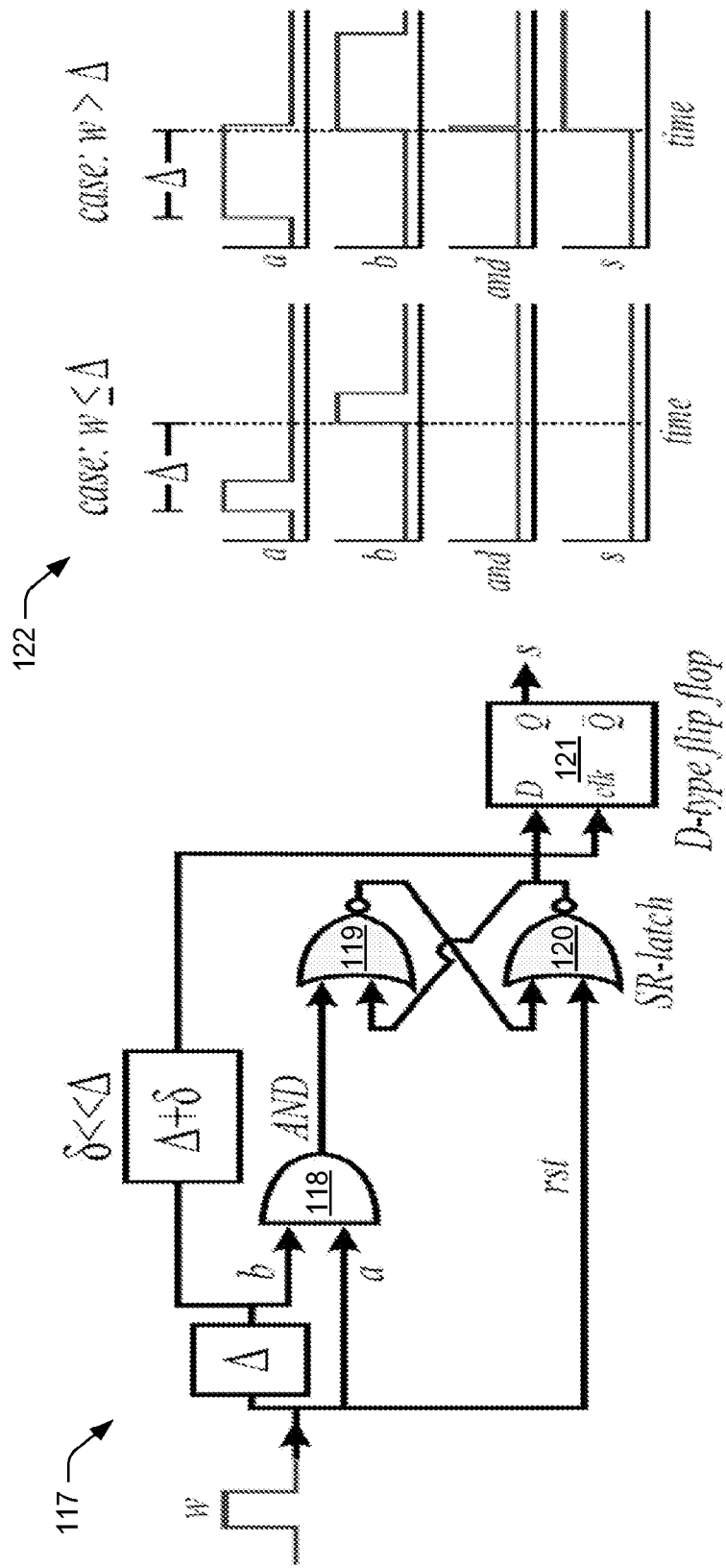
FIG. 1E illustrates an example of circuitry that constitute a component that implements a pulse-width folding operation, in accordance with one or more embodiments of this disclosure.
FIG. 1F illustrates another example of circuitry that constitute a component that implements a pulse-width folding operation, in accordance with one or more embodiments of this disclosure.
FIG. 1G illustrates an example of circuitry that constitutes a component that implements pulse-width stretching operations, in accordance with one or more embodiments of this disclosure.

FIG. 1D is a schematic block diagram of an example of latch circuitry 117 used to produce the high and low logic signals for generation of the binary sequence 12, in accordance with one or more embodiments of this disclosure. The latch circuitry can embody, or can constitute, the latch component 107, flip flop circuitry, latch circuitry, SR-latch, and the like. FIG. 1D also illustrates a corresponding timing diagram 122. The latch circuitry 117 can include an AND gate 118 that receives a continuous width (w) pulse signal as an input (e.g., input a). The continuous width (w) pulse signal can be delayed by a delay line (Δ) and the AND gate 118 can received the delayed pulse as another input (e.g., input b). The output of the AND gate 118 (e.g., input a+input b) can correspond to an AND gate truth table. The output of the AND gate 118 (e.g., input a+input b) can be input to a NOR gate 119 that is configured as a set-reset (S-R) latch with a NOR gate 120. The output of the NOR gate 120 can be input to a D-latch of a D-type flip-flop 121. The D-type flip-flop 121 can be clocked by a delayed pulse of the continuous width (w) pulse signal. The timing diagram 122 plots the input a, the input b, the output of the AND gate 118, and the output of the D-type flip-flop 121 (s) in time for cases when the width of the continuous width (w) pulse signal is less than or equal to the delay line (Δ) and cases when the continuous width (w) pulse signal is greater than the delay line (Δ).

The latch circuitry 117 can compare a width of a signal (e.g., the output of the OR gate 102, yin) used to iterate a map operator (e.g., the map operator 103, etc.) to a fixed time and generate a binary output. The latch circuitry 117 can also generate the binary output to record (e.g., digitally represent) events occurring in time. For example, the binary output can be stored as digital bits (e.g., digital bits of a digital word, etc.) generated by the latch circuitry 117. The binary output can be used to determine/recover the width of a continuous width pulse signal.

Figure 1E:
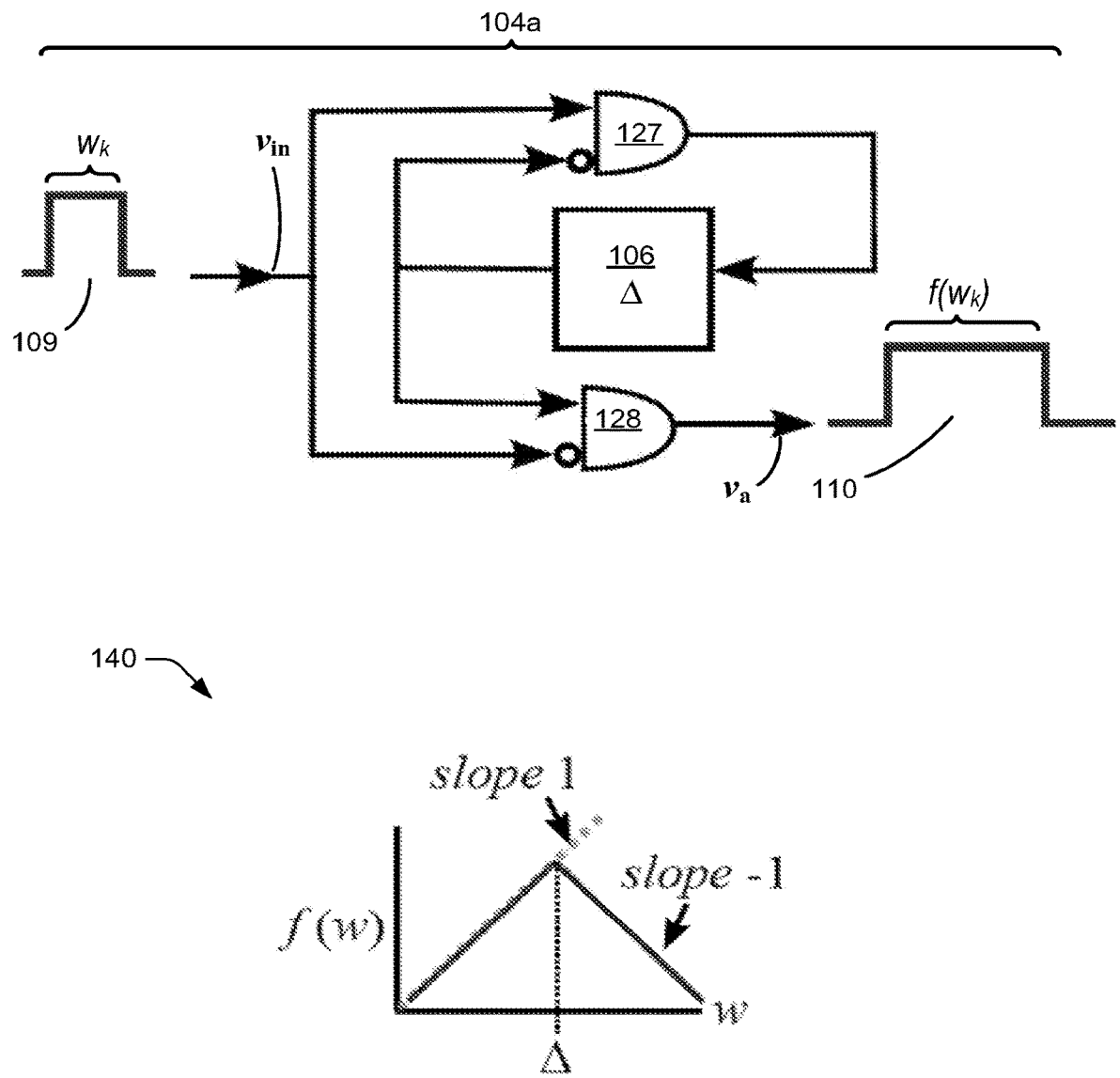
Figure 1F:
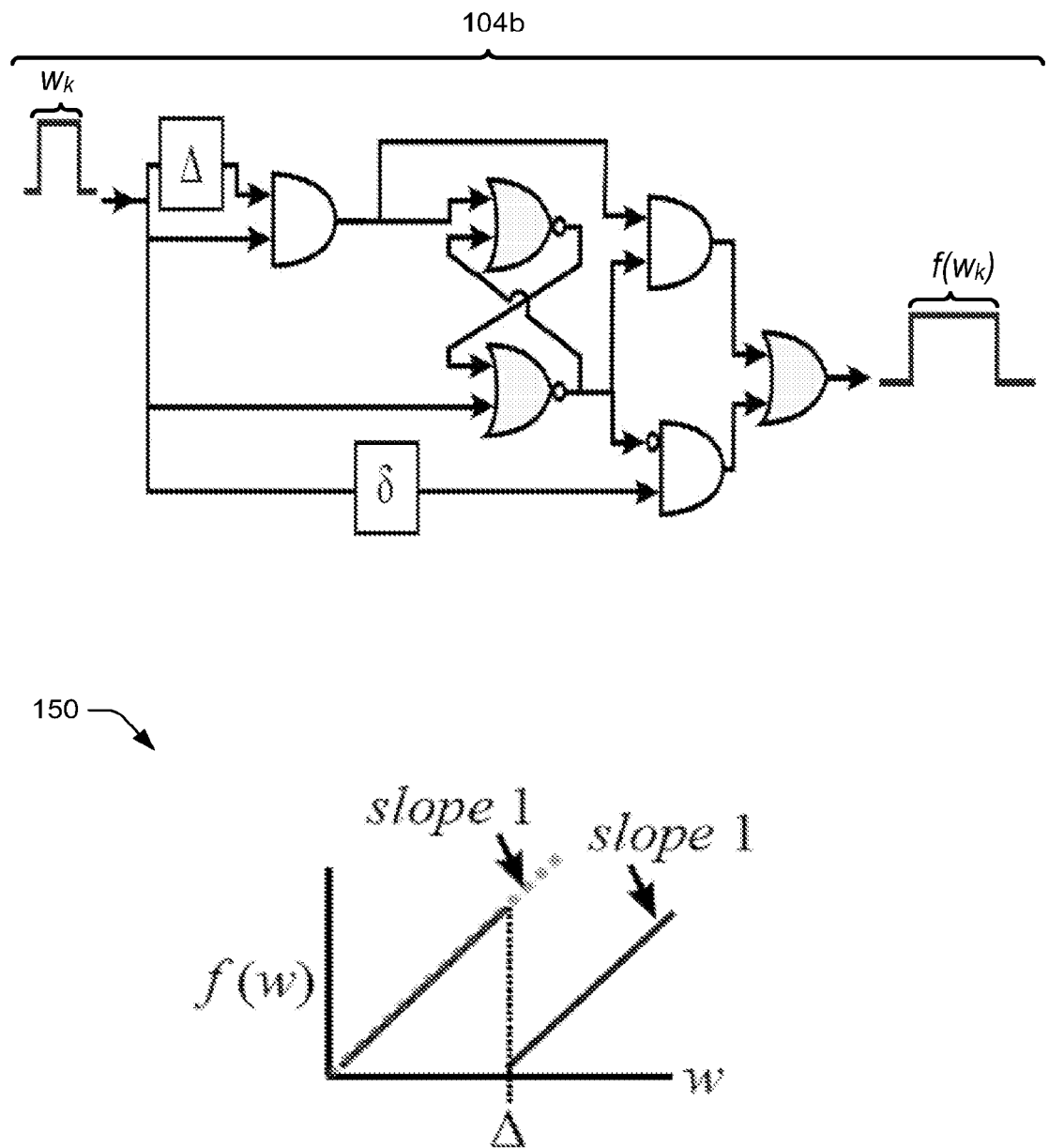

As mentioned, the chaotic map component 103 can be embodied in, or can include, an FPGA or an ASIC, or a combination of both. FIGS. 1E-1F are schematic block diagrams of examples of pulse-width folding component 104 in one of such configurations.

As is illustrated in FIG. 1E, the pulse-width folding component 104 can be embodied in pulse-width folding circuitry 104a that implements a tent folding function $f(\cdot)$. As is illustrated in FIG. 1E, the pulse-width folding circuitry 104a can include a first AND gate 127 and a second AND gate 128 configured as depicted. At least one input of the AND gate 127 and the AND gate 128 can be an inverted input. The input pulse $v_{in}$ can be provided/fed as an input to the AND gate 128 and an inverted input the AND gate 127. An output of the AND gate 128 can be fed back (e.g., routed, provided, etc. . . . ) via the time delay component 106 and provided as an inverted input to the AND gate 128. The AND gate 128 can provide an output to the time delay component 106 according to an AND gate truth table (not shown). The output of the AND gate 128 can be fed back (e.g., routed, provided, etc.) via the time delay component 106 and provided as an input to the AND gate 127. The AND gate 127 can provide the output $v_{out}$ according to an AND gate truth table (not shown). An input pulse 109 (e.g., input pulse 101) of width $w_k$ and an output pulse 110 of width $w_a = f(w_k)$ can be represented by input $v_{in}$ and output $v_a$, respectively. In one example, $w_a = w_{in}$ for $\leq \Delta$ and $w_a = (\Delta - w_{in})$ for $\tau < w_{in} \leq \Delta\tau$, where $\Delta$ represents a propagation delay time/period associated with the time delay component 106 (e.g., delay line). Folding of an input pulse (e.g., the input pulse 101) performed by the pulse-width folding circuitry 104a can be recorded for visualization purposes, for example. As is illustrated in diagram 140 in FIG. 1E, the pulse-width folding circuitry 104a permits implementing a tent fold function $f(w)$, where the cusp of the tent fold corresponds to a delay A provided by the time delay component 106. the pulse-width folding circuitry 104a can be used with a pulse width gain function to create a tent map operator.

Embodiments of the pulse-width folding circuitry 104a are not limited to a particular number of logical components. In some embodiments, the pulse-width folding circuitry 104a can include more than two logical AND gates.

In turn, FIG. 1F illustrates pulse-width folding circuitry 104b that can implement a shift folding function $f(\cdot)$. The pulse-width folding circuitry 104b can include an array of logic elements (e.g., logic gates, such as AND gates, NOR gates, OR gates, or similar) and feedback loops (e.g., delay lines) configured to shift fold a signal (e.g., the input pulse(s) 109, input pulse 101, or the like). As is illustrated in diagram 150 in FIG. 1F, the pulse-width folding circuitry 104b permits implementing a shift fold function $f(w)$, where the shift is performed relative to a delay A provided by the time delay component 106.

Other configurations of pulse-width folding circuitry can constitute the pulse-width folding component 104 in instances in which the chaotic map component 103 is embodied in, or includes, an FPGA or an ASIC, or a combination of both. For example, the map component 103 can include pulse-width folding circuitry 104a that implements the folding function $f(\cdot)$.

Figure 1G:
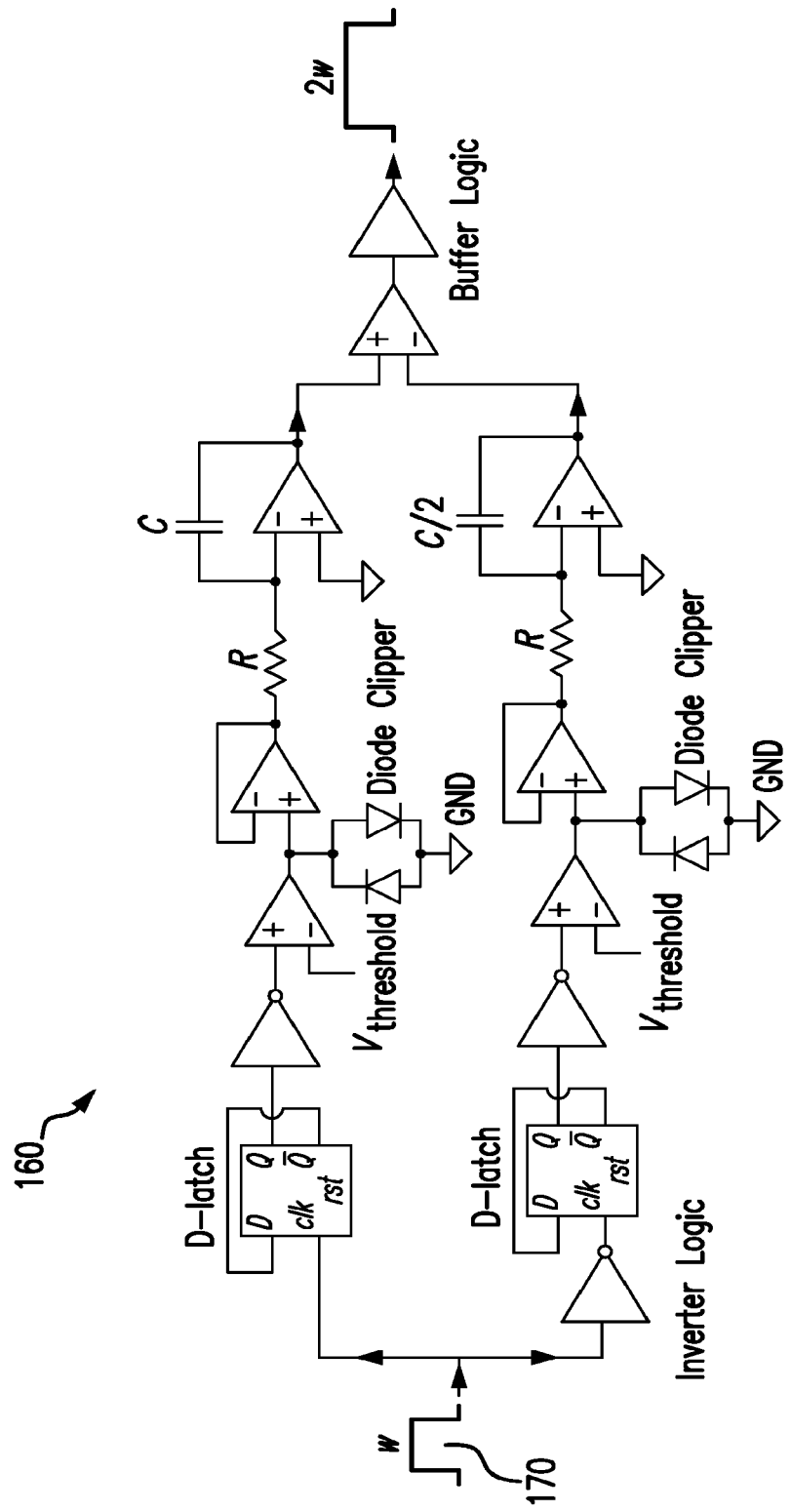

With further reference to configurations in which the chaotic map component 103 can be embodied in, or can include, an FPGA or an ASIC, or a combination of both, FIG. 1G is a schematic block diagram of ideal analog circuitry 160 that can apply a stretching function to an output signal from the digital circuitry 104a or 104b (FIG. 1E). Results of the operations of the analog circuitry 160 are described and illustrated with reference to FIG. 2. In the example arrangement shown in FIG. 1G, the analog circuitry 160 includes pulse preparation circuitry (D-latches, Inverter Logic gates, Buffer operation amplifiers with a threshold voltage $V_{threshold}$, diode clipper circuits) and two operational amplifier integrator circuits. Such an input signal can be embodied in, for example, a square voltage pulse 170 in time-domain having a defined amplitude and a width w. In this case $V_{threshold}$ is selected such that the square voltage pulse is above $V_{threshold}$ when the pulse is present and below $V_{threshold}$ when the pulse is absent. As a result of this example circuit, at a rising edge of the square pulse 170, the first integrator circuitry can begin to integrate such an output signal and can yield a time-dependent output signal 220 having a first defined slope (e.g., m/2). At the falling edge of the square pulse 170, the second integrator circuitry can begin to integrate the square pulse 170 and can yield a time-dependent output signal 230 having a second defined slope (e.g., m). The second defined slope of the second integrator circuitry can be a multiple of the first defined slope of the first integrator.

Figure 2:
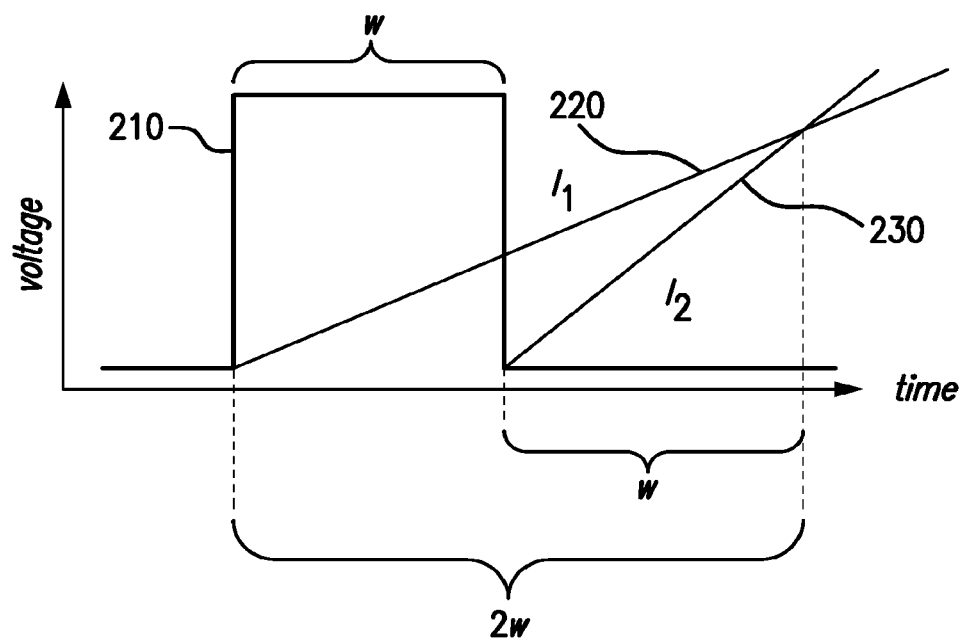
FIG. 2 illustrates the timing diagram for the output voltages of the pulse width-stretching operation, in accordance with one or more embodiments of this disclosure.

In such an example arrangement, the analog circuitry 160 shown in FIG. 1G also can include comparator circuitry to determine when the output signal 220 of the first integrator circuitry is less than the output signal 230 of the second integrator circuitry. The comparator circuitry can be powered on at the falling edge of the square pulse 170 and can be powered off when a magnitude of the time-dependent output signal 220 is less than the time-dependent output signal 230. Initial conditions of the latches and integrators are set to accommodate the stretching function $f$ or each input pulse. Output signal from the comparator circuitry can span a continuous time interval having a defined width w' corresponding to $\gamma w$, where $\gamma$ is the ratio between the second defined slope and the first defined slope. As is illustrated in FIG. 2, in an example configuration in which $\gamma=2$, w' is equal to 2w.

The pulse-width gain component 111 can be embodied in pulse-width gain circuitry that implements the gain function g( ). An output $v_a$ of the pulse-width folding component 104 can be input to the pulse-width gain circuitry. The pulse-width folding component 104 can be embodied in, for example, either one of the pulse-width folding circuitry 104a or the pulse-width folding circuitry 104b (see FIG. 1E). Such an output can be provided as an input signal pulse $v_a$ having a width $w_{in}$ to the pulse-width gain circuitry.

As described and illustrated in FIG. 1, FIGS. 1A-1E, and FIGS. 2-6, a clockless system can produce a chaotic map and the corresponding continuous dynamical states. Thus, this method uses a time-stretching function in conjunction with a time-folding function. This time-stretching and time-folding process can be also be embodied in a single process. The resulting structures encode the pulse width without using the discretized measurement unit associated with a clock.

In one example, FIG. 3 demonstrates an example formalism that supports the principles of operations of TDC apparatuses herein. Specifically, the formalism supports the folding, stretching, and latching operations of a time-based chaotic shift map. For a given value A and an initial pulse width $w_0$ the folding and stretching operations are performed iteratively to cycle obtain pulse widths $w_{k+1} = g(f(w_k)) = M(w_k)$, where M is the total map operator. At the same time, a latch operator $S_{latch}$ compares the widths $w_k$ to a threshold A and produces binary bits. The resulting bits are used to form a digital word s that encodes the pulse width. The final binary code can then be used to compute/recover the input pulse width $w_0$ to within the specific resolution (number of bits in s).

Figure 4:
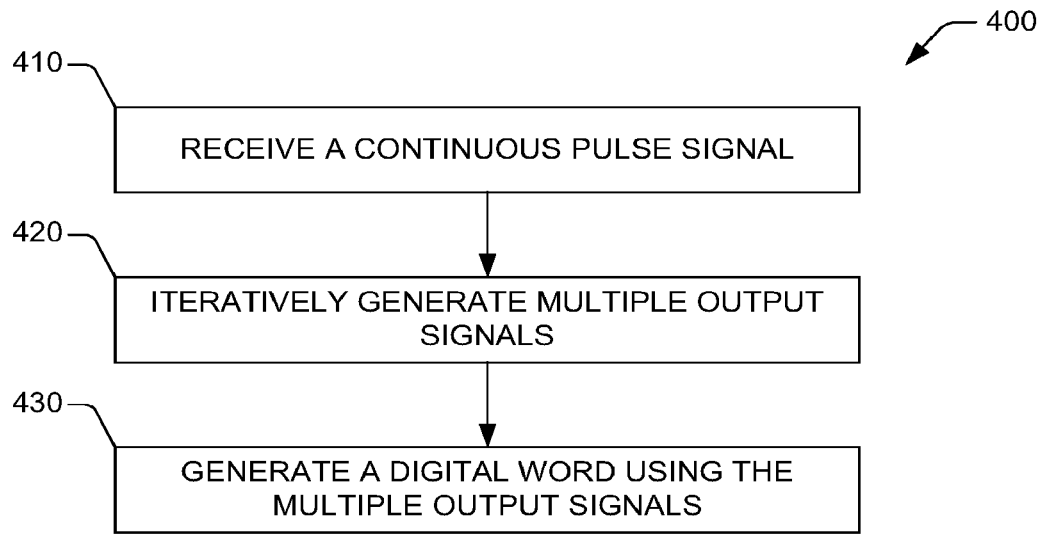
FIG. 4 illustrates an example of a method for providing continuous-time chaos-based time-to-digital conversion, in accordance with one or more embodiments of this disclosure.
Figure 5:
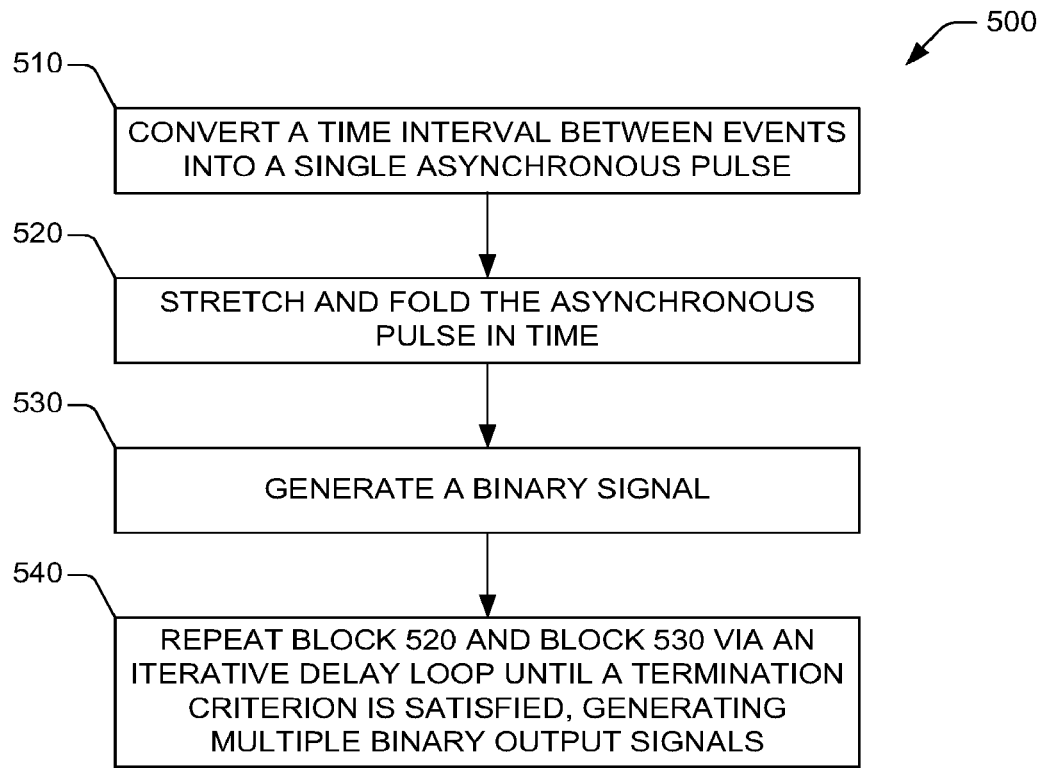
FIG. 5 illustrates an example of a method for providing continuous-time chaos-based time-to-digital conversion.
Figure 6:
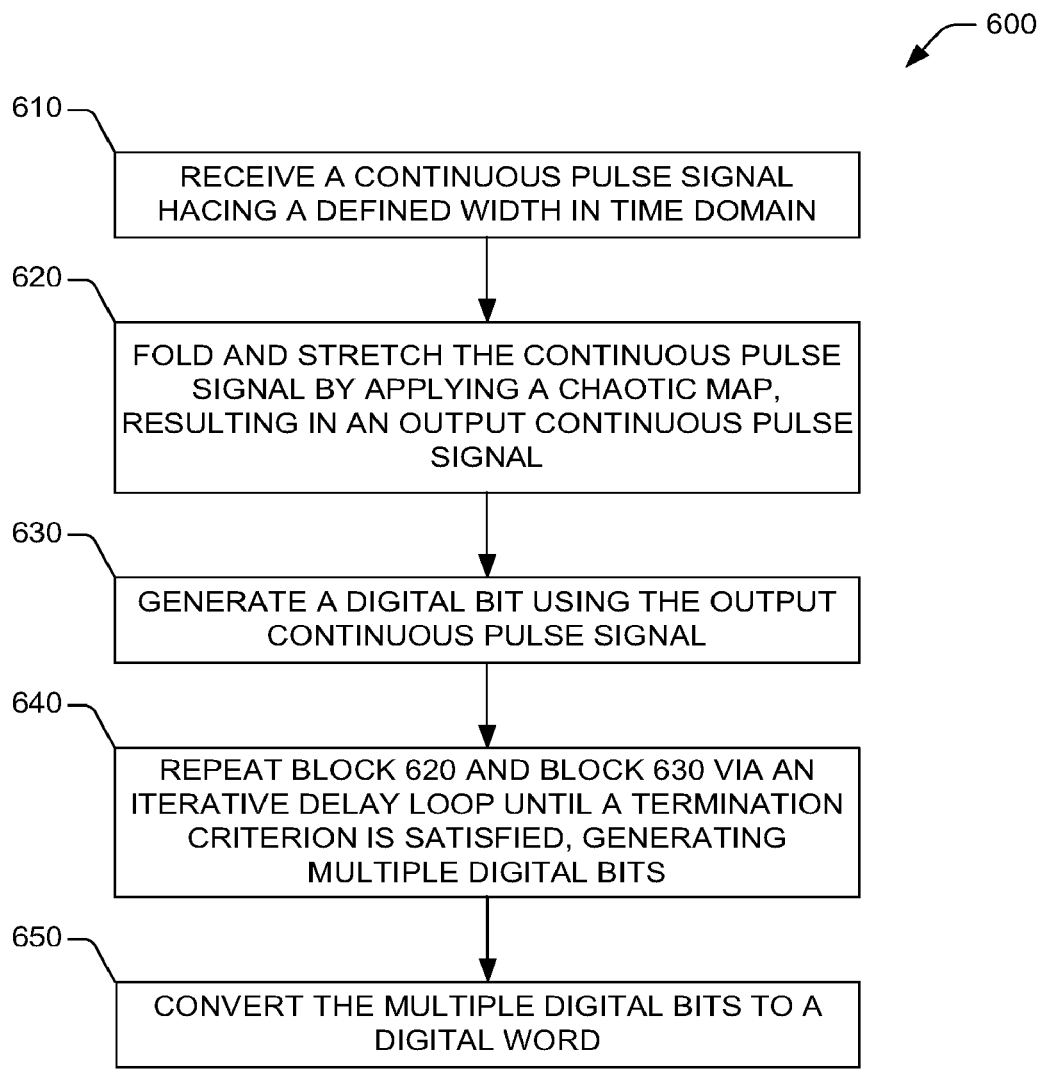
FIG. 6 illustrates an example of a method for providing continuous-time chaos-based time-to-digital conversion.

FIG. 4, FIG. 5 and FIG. 6 illustrate examples of the techniques that emerge from the principles of this disclosure. While the exemplified methods are presented and described as a series of acts or operations that are performed in a sequence, the disclosure is not limited in that respect. Indeed, any one of the methods disclosed herein is not limited by the order (explicit or implied) of a specific sequence of acts or operations. For example, some acts or operations can occur in a different order than what is illustrated herein. In addition, an act or operation can occur concurrently with another act or operation. Further, in some instances, not all acts or operations may be required to implement a method or group of methods disclosed herein. In some embodiments, the acts or operations disclosed in connection with any of the methods in accordance with this disclosure may be machine-accessible instructions (e.g., machine-readable and/or machine-executable instructions) that can be executed or otherwise implemented by one or many signal processing devices and/or can be stored on machine-readable storage media or storage circuitry.

FIG. 4 is a flowchart of an example method 400 for clockless continuous-time chaos-based time-to-digital conversion. The example method 400 can be performed by an apparatus or system including multiple components assembled to operate as a TDC apparatus in accordance with this disclosure. The apparatus and the system can each include processing circuitry and storage circuitry in accordance with aspects of this disclosure.

At block 410, a system can receive a continuous pulse signal (e.g., input pulse 101 (FIG. 1A)). The continuous pulse signal can be a single asynchronous digital pulse, for example.

At block 420, the system can iteratively generate multiple output signals. The multiple output signals (e.g., output $v_{out}$ (FIG. 1A)) can be iteratively determined based at least on the continuous pulse signal. For example, each output of the plurality of outputs can be associated with an FPGA of the plurality FPGAs. Each output can be mapped to a region of a time-based chaotic map (e.g., a tent map, a Bernoulli shift map, a logistic map, graph 302, graph 402).

At block 430, the system can generate a digital word d using the multiple output signals. The digital word can include binary numbers. The digital word d can include a defined number N of bits: $d = d_0 d_1 d_2 \ldots d_{N-2} d_{N-1}$, where $d_k$ represents a bit (k=0, 1 ... N−1). Each bit in the digital word d corresponds to an output signal of the multiple output signals. For example, a most significant bit (MSB) of the plurality of bits can correspond to the first bit and a least significant bit (LSB) of the plurality of bits can correspond to a last bit.

FIG. 5 is a flowchart of an example method 500 for clockless continuous-time chaos-based time-to-digital conversion. The example method 500 can be performed by an apparatus or system including multiple components assembled to operate as a TDC apparatus in accordance with this disclosure. The apparatus and the system can each include processing circuitry and storage circuitry in accordance with aspects of this disclosure. At block 510, separate pulses can be converted to a single asynchronous digital pulse.

At block 520, the asynchronous digital pulse can be stretched and folded. The asynchronous digital pulse can be provided to a pulse-width folding component (e.g., pulse-width folding circuitry 104a or pulse-width folding circuitry 104b (FIG. 1E)) and/or a pulse-width stretching component (e.g., pulse-width gain circuitry 160 (FIG. 1G)).

At block 530, a binary signal can be generated. The binary signal can be a sample from the output of the pulse-width stretching component. For example, the output of the pulse-width stretching component can be compared to a threshold. If a value of the output satisfies or exceeds the threshold, a binary value of 1 can be recorded, and if the value of the output does not satisfy the threshold, a binary value of 0 can be recorded. The binary signal can be a quantized digital representation of the separated pulses (e.g., an analog occurrence, etc.). The binary output can be and/or can be used to determine a bit of a digital word including multiple bits.

At block 540, the operations in block 520 and block 540 can be repeated until a termination criterion is satisfied. For example, the process of stretching and folding the asynchronous pulse and determining a binary output can be repeated using a feedback delay loop until precision of the binary output determination is overwhelmed by noise. Repeating the operations in block 520 and block 540 can generate multiple binary output signals that can represent respective bits of a digital word. The digital word can include any number of bits (e.g., N bits), such that $d_k$, represents the digital word, where k=0, 1 ... N−1. Each bit of the plurality of bits can correspond to the determined binary representation. For example, a LSB of the plurality of bits can correspond to a first determined binary output and an MSB of the plurality of bits can correspond to a last determined binary output.

FIG. 6 is a flowchart of an example of a method 600 for clockless continuous-time chaos-based time-to-digital conversion, in accordance with one or more embodiments of this disclosure. The example method 600 can be performed by an apparatus or system including multiple components assembled to operate as a TDC apparatus in accordance with this disclosure. The apparatus and the system can each include processing circuitry and storage circuitry in accordance with aspects of this disclosure. At block 610, clockless TDC apparatus can receive a continuous pulse signal having a defined width in time domain. For example, the continuous pulse signal can be the embodied in the precursor pulse signal 15 having width Wo. The precursor pulse 15 can result from converting separate pulses representing the timing between events (e.g., asynchronous photon arrivals) into a single digital pulse.

At block 620, the continuous pulse signal can be folded and stretched by applying a chaotic map (e.g., a tent map, a Bernoulli shift map, a logistic map, or the like), resulting in an output continuous pulse signal. The output continuous pulse signal has a second defined width (e.g., $w_k$). For example, the continuous pulse signal can be provided to and/or propagate through a pulse-width folding component (e.g., pulse-width folding circuitry 104a, pulse-width folding circuitry 105b) and/or pulse-width gain component (e.g., pulse-width gain circuitry 160 (FIG. 1G). Such components can be configured within an FPGA and other analog circuitry, for example.

At block 630, the clockless TDC apparatus can generate a digital bit using the output continuous pulse signal that results from applying the chaotic map. For example, the output continuous pulse signal can be provided to a latch component (e.g., latch circuitry 117, flip-flop circuitry, SR-latch, or similar). See FIG. 1A, for example. The latch component can compare the second defined width of the output continuous pulse signal to a defined amount time and can generate the digital bit. The defined amount of time can be a preset time window or another type of predetermined time, for example. The digital bit can embody, for example, an element of the binary sequence 12. In some embodiments, the digital bit can be stored by the latch component. In some instances, the digital bit in combination with previously generated digital bits can be used to determine/recover the defined width of the continuous pulse signal received at block 610. For example, the latch component can generate the digital bit in Gray code. The Gray code can be processed/converted to binary coding, hexadecimal coding, or any other type of coding representative of the continuous width pulse.

The operations included in block 620 and block 630 can occur essentially simultaneously in configurations in which the chaotic map uses a piecewise operator that the threshold of that operator is used to partition the map. In such configurations, the chaotic map component 103 that implements the chaotic map can output both the next pulse width and the digital bit.

At block 640, operations in blocks 620 and 630 can be repeated until a termination criterion is satisfied. In one example, the use of the latch circuitry to generate/store a digital bit and the process of folding and stretching the continuous width pulse can be repeated using a time delay component until a defined number of iterations is exceeded. In another example, the use of the latch circuitry to generate/store a digital bit and the process of folding and stretching the continuous width pulse can be repeated using a time delay component until precision of the binary output is satisfied or is overwhelmed by noise. Repeating the operations in blocks 620 and 630 can generate multiple digital bits (e.g., binary outputs) that can represent respective bits of a digital word.

At block 650, the multiple digital bits can be converted to a digital word d. The digital word d can include, for example, a defined number N of bits: $d=d_0 d_1 d_2 \ldots d_{N-2} d_{N-1}$ where cl represents a bit (k=0, 1 . . . N−1). Each bit of the multiple digital bits can correspond, for example, to a respective bit of the binary sequence s 12. For example, a LSB of the multiple digital bits can correspond to a first determined binary output, and an MSB of the multiple digital bits can correspond to a last determined binary output. The multiple digital bits can be used to determine/recover the defined width (e.g., $w_0$) of the continuous pulse signal received at block 510. The multiple digital bits may be converted as needed. For example, the latch component (e.g., latch circuitry 117 (FIG. 1D), flip-flop circuitry, SR-latch, or similar) can generate digital bits in Gray code. The Gray code can be processed/converted to binary coding, hexadecimal coding, or any other type of coding representative of the continuous width pulse.

While the methods and systems have been described in connection with preferred embodiments and specific examples, it is not intended that the scope be limited to the particular embodiments set forth, as the embodiments herein are intended in all respects to be illustrative rather than restrictive.

As used in this application, the terms "environment," "system," "module," "component," "architecture," "interface," "unit," and the like are intended to encompass an entity that includes either hardware, software, or a combination of hardware and software. Such an entity can be embodied in, or can include, for example, a signal processing device. In another example, the entity can be embodied in, or can include, an apparatus with a defined functionality provided by optical parts, mechanical parts, and/or electronic circuitry. The terms "environment," "system," "engine," "module," "component," "architecture," "interface," and "unit" can be utilized interchangeably and can be generically referred to functional elements.

A component can be localized on one processing device or distributed between two or more processing devices. Components can communicate via local and/or remote architectures in accordance, for example, with a signal (either analogic or digital) having one or more data packets (e.g., data from one component interacting with another component in a local processing device, distributed processing devices, and/or across a network with other systems via the signal).

As yet another example, a component can be embodied in or can include an apparatus with a defined functionality provided by mechanical parts operated by electric or electronic circuitry that is controlled by a software application or firmware application executed by a processing device. Such a processing device can be internal or external to the apparatus and can execute at least part of the software or firmware application. Still in another example, a component can be embodied in or can include an apparatus that provides defined functionality through electronic components without mechanical parts. The electronic components can include signal processing devices to execute software or firmware that permits or otherwise facilitates, at least in part, the functionality of the electronic components. For the sake of illustration, an example of such processing device(s) includes an integrated circuit (IC), an application-specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed or otherwise configured (e.g., manufactured) to perform the functions described herein.

In some embodiments, components can communicate via local and/or remote processes in accordance, for example, with a signal (either analog or digital) having one or more data packets (e.g., data from one component interacting with another component in a local system, distributed system, and/or across a network such as a wide area network with other systems via the signal). In addition, or in other embodiments, components can communicate or otherwise be coupled via thermal, mechanical, electrical, and/or electromechanical coupling mechanisms (such as conduits, connectors, combinations thereof, or the like). An interface can include input/output (I/O) components as well as associated processors, applications, and/or other programming components.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language generally is not intended to imply that features, elements, and/or operations are in any way required for one or more implementations or that one or more implementations necessarily include logic for deciding, with or without user input or prompting, whether these features, elements, and/or operations are included or are to be performed in any particular implementation.

The flowchart and block diagrams in the Figures illustrate the architecture, functionality, and operation of possible implementations of examples of systems, methods, and computer program products according to various embodiments of the present disclosure. In this regard, each block in the flowchart or block diagrams may represent a module, segment, or portion of instructions, which includes one or more machine-executable or computer-executable instructions for implementing the specified operations. It is noted that each block of the block diagrams and/or flowchart illustration, and combinations of blocks in the block diagrams and/or flowchart illustration, can be implemented by special purpose hardware-based devices that perform the specified functions or operations or carry out combinations of special purpose hardware and computer instructions.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

What has been described herein in the present specification and annexed drawings includes examples of systems, apparatuses, devices, and techniques for time-to-digital conversion using chaotic maps, without reliance on a clocking signal. It is, of course, not possible to describe every conceivable combination of components and/or methods for purposes of describing the various elements of the disclosure, but it can be recognized that many further combinations and permutations of the disclosed elements are possible. Accordingly, it may be apparent that various modifications can be made to the disclosure without departing from the scope or spirit thereof. In addition, or as an alternative, other embodiments of the disclosure may be apparent from consideration of the specification and annexed drawings, and practice of the disclosure as presented herein. It is intended that the examples put forth in the specification and annexed drawings be considered, in all respects, as illustrative and not limiting. Although specific terms are employed herein, they are used in a generic and descriptive sense only and not for purposes of limitation.

The invention claimed is:

1. A method comprising:
   receiving a first pulse having a first pulse width;
   generating a second pulse having a second pulse width, wherein the second pulse width is based on a reference time interval of a first signal processor and based on the first pulse width;
   generating a third pulse having a third pulse width, wherein the third pulse width is based on a reference time interval of a second signal processor and based on the second pulse width, wherein the reference time interval of the second signal processor and the reference time interval of the first signal processor are substantially equivalent;
   determining, based on the second pulse width, a first bit; and
   determining, based on the third pulse width, a second bit.

2. The method of claim 1, wherein the first signal processor and the second signal processor are arranged in a sequential order.

3. The method of claim 1, further comprising:
   determining, based on the first bit and the second bit, a binary number.

4. The method of claim 3, wherein the binary number comprises the first bit and the second bit and wherein the first bit is more significant than the second bit.

5. The method of claim 3, further comprising:
   determining, based on the binary number, a quantity of time associated with the first pulse width.

6. A method comprising:
   receiving a first pulse having a first pulse width;
   generating a second pulse having a second pulse width, wherein the second pulse width is based on a propagation delay of a first signal processor and based on the first pulse width;
   generating a third pulse having a third pulse width, wherein the third pulse width is based on a propagation delay of a second signal processor and based on the second pulse width, wherein the propagation delay of the second signal processor and the propagation delay of the first signal processor are substantially equivalent;
   determining, based on the second pulse width, a first bit; and
   determining, based on the third pulse width, a second bit.

7. The method of claim 6, wherein the first signal processor and the second signal processor are arranged in a sequential order.

8. The method of claim 6, further comprising:
   determining, based on the first bit and the second bit, a binary number.

9. The method of claim 8, wherein the binary number comprises the first bit and the second bit and wherein the first bit is more significant than the second bit.

10. The method of claim 8, further comprising:
    determining, based on the binary number, a quantity of time associated with the first pulse width.

11. The method of claim 6, wherein determining the first bit comprises:
    comparing a predetermined time interval with the second pulse width.

12. A method comprising:
    receiving a first pulse having a first pulse width;
    generating, based on a propagation delay of a component and based on the first pulse width, a second pulse having a second pulse width;
    generating, based on the propagation delay of the component and based on the second pulse width, a third pulse having a third pulse width;
    determining, based on the second pulse width, a first bit; and
    determining, based on the third pulse width, a second bit.

13. The method of claim 12, further comprising:
    determining, based on the first bit and the second bit, a binary number.

14. The method of claim 13, wherein the binary number comprises the first bit and the second bit and wherein the first bit is more significant than the second bit.

15. The method of claim 13, further comprising:
    determining, based on the binary number, a quantity of time associated with the first pulse width.

16. The method of claim 12, wherein the first pulse width is based on a fourth pulse and a fifth pulse and wherein a leading edge of the first pulse corresponds to a leading edge of the fourth pulse and a trailing edge of the first pulse corresponds to a leading edge of the second pulse.

17. The method of claim 12, further comprising:
    mapping the second pulse width and the third pulse width to a region of a chaotic map.

18. The method of claim 17, wherein the chaotic map is a tent map or a Bernoulli shift map.

19. The method of claim 12, wherein determining the first bit comprises:
    comparing a predetermined time interval with the second pulse width.

20. The method of claim 12, wherein generating the second pulse comprises:
    folding the first pulse to shorten the first pulse width; and
    stretching the first pulse to lengthen the first pulse width.

* * * * *